(12) United States Patent
Chu et al.

(10) Patent No.: US 12,165,920 B2
(45) Date of Patent: Dec. 10, 2024

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Hwei-Jay Chu, Hsinchu (TW); Chieh-Han Wu, Kaohsiung (TW); Cheng-Hsiung Tsai, Miaoli County (TW); Chung-Ju Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 517 days.

(21) Appl. No.: 17/461,161

(22) Filed: Aug. 30, 2021

(65) Prior Publication Data

US 2023/0062825 A1   Mar. 2, 2023

(51) Int. Cl.
*H01L 21/768* (2006.01)
*H01L 23/522* (2006.01)

(52) U.S. Cl.
CPC .. *H01L 21/76897* (2013.01); *H01L 21/76807* (2013.01); *H01L 21/76831* (2013.01); *H01L 21/76832* (2013.01); *H01L 23/5226* (2013.01); *H01L 21/76885* (2013.01); *H01L 2221/1026* (2013.01); *H01L 2221/1036* (2013.01)

(58) Field of Classification Search
CPC ............... H01L 23/585; H01L 23/5226; H01L 21/76831; H01L 21/76832; H01L 21/76834; H01L 21/76849; H01L 21/76897; H01L 21/76807; H01L 24/19; H01L 24/25
See application file for complete search history.

(56) References Cited

U.S. PATENT DOCUMENTS

| | | | |
|---|---|---|---|
| 9,548,366 B1 * | 1/2017 | Ho | H01L 21/823475 |
| 10,388,600 B2 * | 8/2019 | Reznicek | H01L 23/53209 |
| 2011/0100697 A1 * | 5/2011 | Yang | H01L 21/76831 174/262 |
| 2014/0264872 A1 * | 9/2014 | Lin | H01L 23/53233 257/751 |
| 2015/0179515 A1 * | 6/2015 | Jezewski | H01L 23/5329 257/774 |
| 2015/0235948 A1 * | 8/2015 | Song | H01L 27/088 438/586 |
| 2018/0033727 A1 * | 2/2018 | Lee | H01L 21/76844 |
| 2018/0040686 A1 * | 2/2018 | Yang | H01L 28/60 |

(Continued)

*Primary Examiner* — Jaehwan Oh
*Assistant Examiner* — John M Parker
(74) *Attorney, Agent, or Firm* — WPAT LAW; Anthony King

(57) ABSTRACT

A semiconductor structure includes a first metallization feature, a first dielectric structure over the first metallization feature, a second metallization feature embedded in the first dielectric structure, a via structure between the first metallization feature and the second metallization feature, and a first insulating layer between the first dielectric structure and the first metallization feature, and between the first dielectric structure and the via structure. The first metallization feature extends along a first direction, and the second metallization feature extends along a second direction different from the first direction. The first insulating layer covers first sidewalls of the via structure along the second direction.

20 Claims, 13 Drawing Sheets

(56) References Cited

U.S. PATENT DOCUMENTS

| | | | |
|---|---|---|---|
| 2018/0164698 A1* | 6/2018 | Yang | G03F 7/0047 |
| 2022/0157710 A1* | 5/2022 | Li | H01L 21/76831 |
| 2023/0275156 A1* | 8/2023 | You | H01L 27/0886 |
| | | | 257/288 |

* cited by examiner

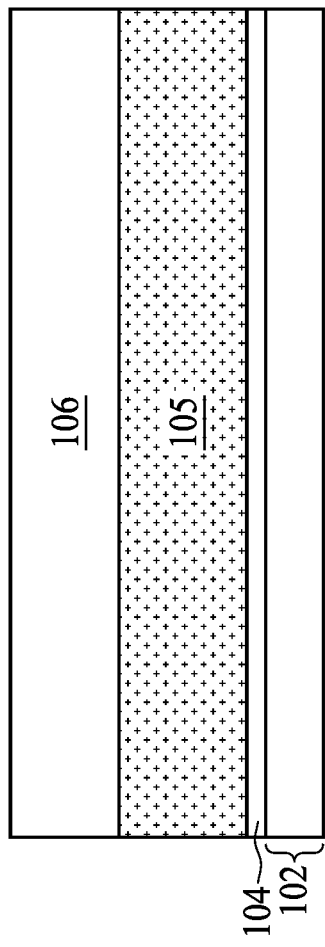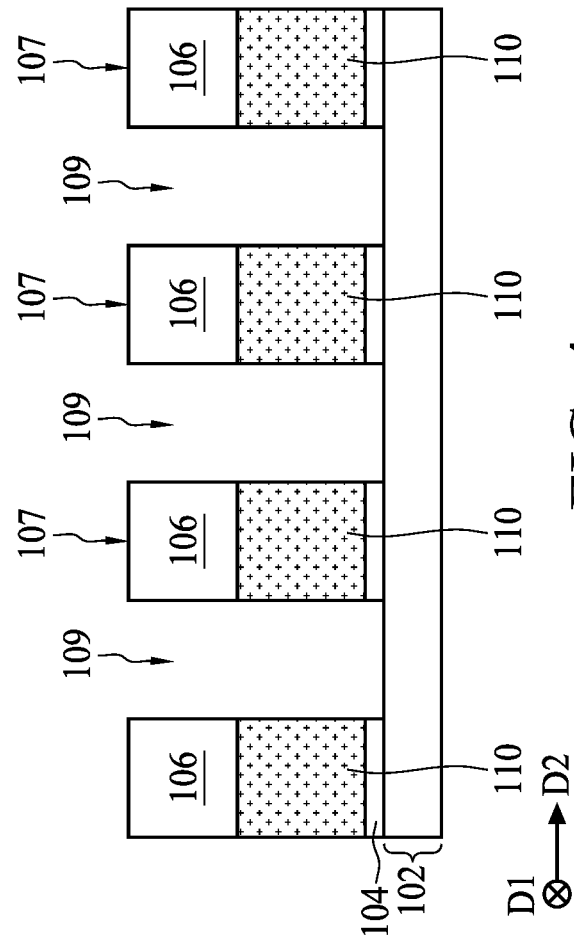

SEMICONDUCTOR STRUCTURE AND METHOD FOR FORMING THE SAME

BACKGROUND

The semiconductor integrated circuit (IC) industry has experienced rapid growth. Technological advances in IC materials and design have produced continuous improvements in succeeding generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., scale of the smallest component (or line) that can be created using a fabrication process) has decreased. This scaling-down process generally provides benefits by increasing production efficiency and reducing associated costs.

However, as the feature sizes continue to decrease, fabrication processes continue to become more difficult to perform. Thus, there is a challenge to form reliable semiconductor devices of smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A and 1B are schematic drawings illustrating a semiconductor structure according to various aspects of the present disclosure, wherein FIG. 1B is a cross-sectional view taken along a line I-I' of FIG. 1A.

FIGS. 3, 4, 5, 6A, 7A, 8, 9, 10A, 11A, 12A, 13A, 14A and 15A are schematic drawings illustrating various stages in a method for forming a semiconductor structure according to aspects of one or more embodiments of the present disclosure.

DETAILED DESCRIPTION

Figure 1A:
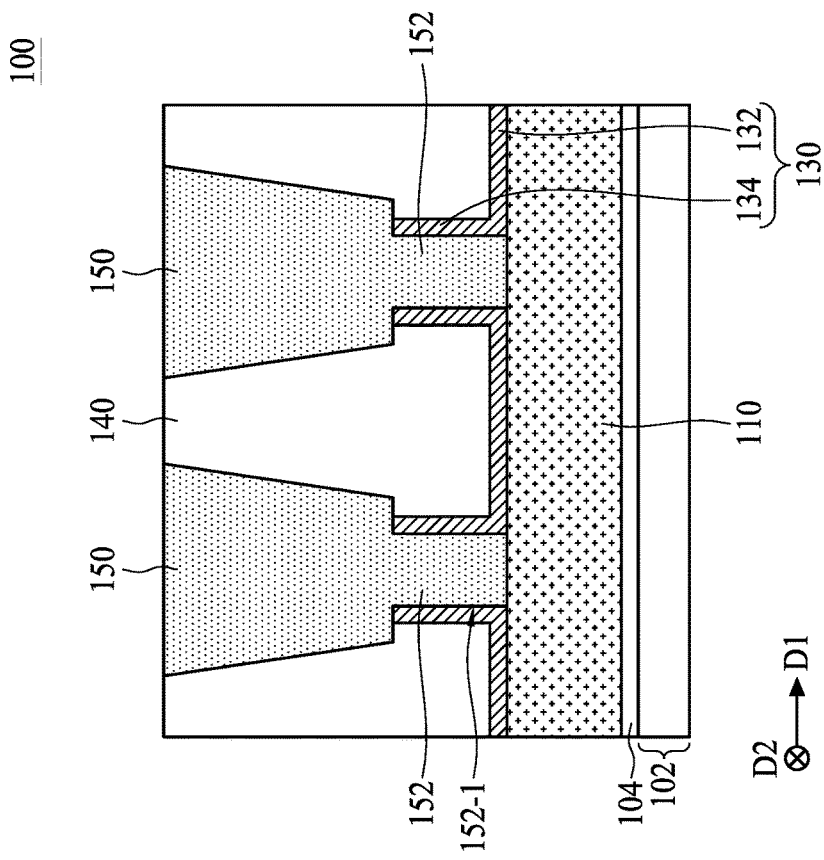

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

An IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include formation of isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include formation of connecting structures that connect to the gate structures and connecting structures that connect to the source/drain structures. BEOL generally encompasses processes related to fabrication of multilayer interconnect (MLI) structures that electrically connect the IC devices to the connecting structures fabricated by FEOL and MEOL. Accordingly, operation of the IC devices can be enabled. As mentioned above, the scaling-down processes have increased the complexity of processing and manufacturing ICs.

In some embodiments, a BEOL interconnect structure can include a plurality of metal layers referred to, in ascending order, as the zeroth metal layer M0, the first metal layer M1, and the Nth metal layer Mn, and a plurality of connecting vias referred to as the zeroth via V0, the first via V1, and the (N−1)th via V(n−1), wherein n is a positive integer. The (N−1)th metal layer M(n−1) and the Nth metal layer Mn can be electrically connected by the (N−1)th via V(n−1). Further, the metal layer Mn and the connecting vias V(n−1) can be formed in an inter-metal dielectric layer IMDn, which provides mechanical support and electrical isolation for the metal layer Mn and the connecting via V(n−1). In some embodiments, the formation of the metal layers Mn and the connecting via V(n−1) can include forming trenches and via openings in the inter-metal dielectric layer IMDn, filling the trench and the via openings with conductive materials and performing a planarization such as a chemical mechanical polishing (CMP) operation.

In some comparative approaches, it is found that as dimension continuously shrinks, complexity for layout scheme design and fabrication operations of the BEOL interconnect structure is increased. For example, during forming of the via opening, an overlay control of the photolithography is more challenging because resistance between the via structure and the underlying and overlaying metal layers may be increased due to misalignment issue or overlay shift issue. The misalignment issue or overlay shift issue may further cause a tiger-tooth issue. The tiger-tooth issue arises when an overlay shift occurs and the via is formed with a tapered profile, like a tooth, over the underlying metal layer. The tiger tooth provides an electrical leakage path. Further, the via-etching operation needs a complex etch-stop layer (ESL) structure for via etching loading control. The complex ESL structure may cause a capacitance issue in the BEOL interconnect structure.

The present disclosure therefore provides a semiconductor structure and a method for forming the same. In some embodiments, an etch-free via-forming method is provided. In such embodiments, a via opening can be formed without etching the dielectric layer. Thus, the ESL structure may not be required in the etch-free via-forming operation. Further, overlay control can be simplified by the etch-free via-forming operation. Accordingly, the overlay shift issue and the tiger-tooth issue can both be mitigated, and the device performance can be improved.

Figure 1B:
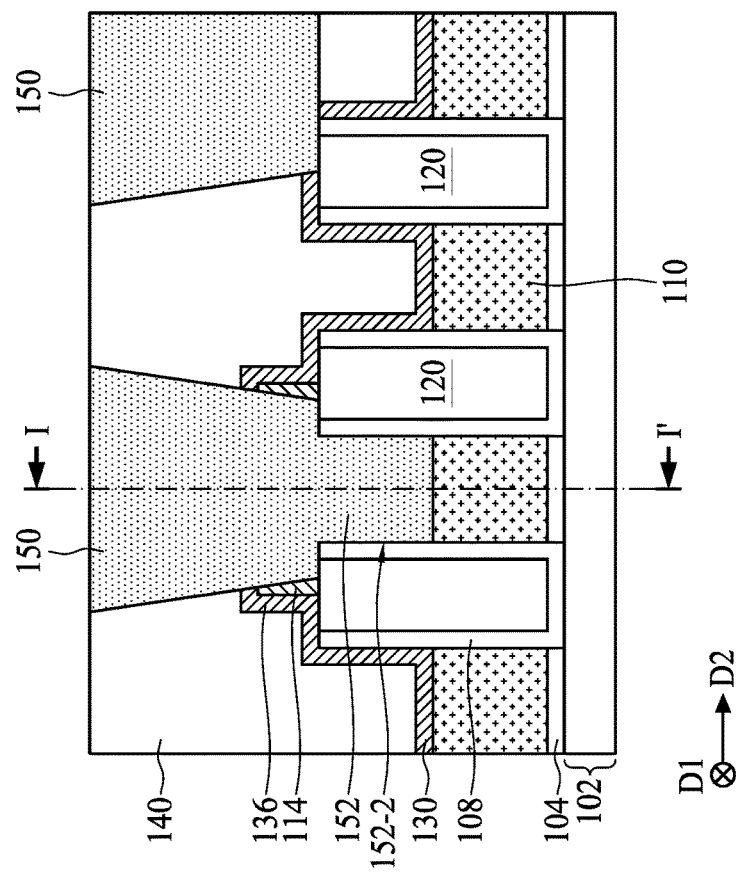

FIGS. 1A and 1B are schematic drawings illustrating a semiconductor structure according to various aspects of the present disclosure, wherein FIG. 1B is a cross-sectional view taken along a line I-I' of FIG. 1A. In some embodiments, a semiconductor structure 100 is provided. The semiconductor structure 100 can include a substrate (not shown). In some embodiments, the substrate including FEOL devices can be a portion of an IC chip, a system on chip (SoC), or a portion of the SoC. In some embodiments, the substrate can be a substrate accommodating FEOL devices such as microprocessors, memories, and/or other IC devices. In some embodiments, the substrate can include various passive and active microelectronic devices, such as resistors, capacitors, inductors, diodes, p-type field-effect transistors (PFETs), n-type field-effect transistors (NFETs), metal-oxide semiconductor field effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, other suitable components, or combination thereof. The transistors may be planar transistors or multi-gate transistors, such as fin-like FETs (FinFETs).

In some embodiments, a layer of MEOL interconnect structure 102 can be formed over the substrate. The layer of MEOL interconnect structure 102 includes a plurality of connecting vias (not shown) disposed in an inter-layer dielectric (ILD) layer (not shown). The connecting vias are coupled to the FEOL devices. In some embodiments, the connecting vias can include a via-to-gate (VG), which generally refers to a contact to a gate structure. In other embodiments, the connecting via can include a via-to-drain (VD), which generally refers to a contact to a source/drain region. Accordingly, the FEOL devices can be electrically connected to a BEOL interconnect structure through the layer of MEOL interconnect structure 102.

The semiconductor structure 100 includes at least a first metallization feature 110 disposed over the layer of MEOL interconnect structure 102. In some embodiments, a glue layer 104 may be disposed between the first metallization feature 110 and the layer of MEOL interconnect structure 102. The glue layer 104 helps to improve adhesion between the first metallization feature 110 to the layer of MEOL interconnect structure 102. In some embodiments, the glue layer 104 may include semiconductor material, insulating material or conductive material. For example, the glue layer 104 can include silicon (Si) silicon oxide (SiO), silicon nitride (SiN), silicon carbon nitride (SiCN), silicon oxynitride (SiON), metals, metal nitrides, or a combination thereof. In some embodiments, a thickness of the glue layer 104 may be between approximately 5 angstroms and approximately 200 angstroms, but the disclosure is not limited thereto. In some embodiments, the first metallization feature 110 may include metals, metal nitride, or combinations thereof. For example, the first metallization feature 110 can include tantalum (Ta), tantalum nitride (TaN), titanium nitride (TiN), copper (Cu), cobalt (Co), tungsten (W), ruthenium (Ru), aluminum (Al), molybdenum (Mo), iridium (Ir), alloys of the aforementioned materials, or a combination thereof. In some embodiments, the first metallization feature 110 may extend along a first direction D1. In some embodiments, the first metallization feature 110 may be electrically connected to the layer of MEOL interconnect structure 102. In such embodiments, the first metallization feature 110 can be referred to as a zeroth metal layer M0 of a BEOL interconnect structure, but the disclosure is not limited thereto. In some embodiments, the first metallization feature 110 can be referred to as an (N−1)th metal layer M(n−1) of the BEOL interconnect structure.

The semiconductor structure 100 further includes at least a dielectric structure 120. In some embodiments, the dielectric structure 120 may extend along the first direction D1. In other words, an extending direction of the dielectric structure 120 and an extending direction of the first metallization feature 110 are parallel to each other. In some embodiments, the dielectric structures 120 and the first metallization features 110 may be alternately arranged along a second direction D2, which is different from the first direction D1, as shown in FIGS. 1A and 1B. In some embodiments, a height of the dielectric structure 120 is greater than a height of the first metallization feature 110. In some embodiments, the height of the dielectric structure 120 can be between approximately 30 angstroms and approximately 3000 angstroms, but the disclosure is not limited thereto. The dielectric structure 120 can include silicon carbide (SiC), silicon oxide, silicon oxy-carbide (SiOC), silicon nitride, silicon carbon nitride, silicon oxynitride, silicon oxycarbonitride (SiOCN), or a combination thereof.

The semiconductor structure 100 further includes another dielectric structure 140 over the first metallization feature 110 and the dielectric structure 120. In some embodiments, a height of the dielectric structure 140 can be greater than the height of the dielectric structure 120, but the disclosure is not limited thereto. Materials used to form the dielectric structure 140 can be similar to those of the dielectric structure 120; therefore, repeated descriptions of such details are omitted for brevity. In some embodiments, the dielectric structure 140 and the dielectric structure 120 can include materials similar materials, but the disclosure is not limited thereto. In some alternative embodiments, the dielectric structure 140 and the dielectric structure 120 can include different materials.

The semiconductor structure 100 further includes a second metallization feature 150 embedded in the dielectric structure 140. In some embodiments, the second metallization feature 150 may extend along the second direction D2. Further, the semiconductor structure 100 includes a via structure 152 between the first metallization feature 110 and the second metallization feature 150. The via structure 152 electrically connects the second metallization feature 150 to the first metallization feature 110. The via structure 152 and the second metallization feature 150 can include the same material. In some embodiments, the second metallization feature 150 can be referred to as a first metal layer M1 of the BEOL interconnect structure. Alternatively, the second metallization feature 150 can be referred to as an Nth metal layer Mn of the BEOL interconnect structure.

In some embodiments, the semiconductor structure 100 includes an insulating layer 130 between the dielectric structure 140 and the first metallization feature 110, and between the dielectric structure 140 and the via structure 152. In such embodiments, the insulating layer 130 may include a first portion 132 and a second portion 134 coupled to each other. The first portion 132 covers a top surface of the first metallization feature 110 while the second portion 134 covers first sidewalls 152-1 of the via structure 152. In such embodiments, a height of the second portion 134 of the insulating layer 130 is similar to a height of the via structure 152. Additionally, a topmost surface of the second portion 134 of the insulating layer 130 may be in contact with a portion of a bottom surface of the second metallization feature 150, as shown in FIG. 1B. In some embodiments, the insulating layer 130 may further include a third portion 136 over the second portion 134. In such embodiments, the third portion 136 of the insulating layer 130 may be in contact with a sidewall of the second metallization feature 150, as shown in FIG. 1A. In some embodiments, the insulating layer 130 can include silicon oxide, silicon nitride, silicon carbide, silicon oxynitride, silicon oxy-carbide, metal oxides metal nitrides, or a combination thereof. In some embodiments, a thickness of the insulating layer 130 may be between approximately 5 angstroms and approximately 200 angstroms, but the disclosure is not limited thereto.

In some embodiments, the semiconductor structure 100 further includes an insulating layer 108 over sidewalls of the first metallization feature 110 and second sidewalls 152-2 of the via structure 152 along the first direction D1, as shown in FIG. 1A. In other words, the insulating layer 108 is between the dielectric structure 120 and the first metallization feature 110 along the first direction D1. The insulating layer 108 is between the dielectric structure 120 and the second sidewalls 152-2 of the via structure 152 along the first direction D1, as shown in FIG. 1A. A height of the insulating layer 108 is similar to a sum of a height of the first metallization feature 110 and a height of the via structure 152. In some embodiments, a topmost surface of the insulating layer 108 may be in contact with a portion of the bottom surface of the second metallization feature 150. In some embodiments, the insulating layer 108 and the insulating layer 130 can include the same material. In some alternative embodiments, the insulating layer 108 and the insulating layer 130 can include different materials. In some embodiments, a thickness of the insulating layer 108 may be between approximately 5 angstroms and approximately 200 angstroms, but the disclosure is not limited thereto.

It should be noted that the via structure 152 may include the first sidewalls 152-1 and the second sidewalls 152-2. The first sidewalls 152-1 may extend along the second direction D2 while the second sidewalls 152-2 may extend along the first direction D1. Further, along the first direction D1, the second sidewalls 152-2 of the via structure 152 can be adjacent to the insulating layer 108, while the first sidewalls 152-1 of the via structure 152 can be adjacent to the insulating layer 130 (i.e., the second portion 134 of the insulating layer 130) along the second direction D2.

In some embodiments, the semiconductor structure 100 may include an insulating layer 114 between the second metallization feature 150 and the insulating layer 130. In such embodiments, the insulating layer 114 is between sidewalls of the second metallization feature 150 and the third portion 136 of the insulating layer 130 along the first direction D1. The insulating layer 114 can include silicon, silicon oxide, silicon nitride, silicon carbon nitride, silicon oxynitride, silicon oxy-carbide, silicon carbide, or a combination thereof.

Additionally a barrier layer (not shown) may be disposed between the first sidewalls 152-1 of the via structure 152 and the second portion 134 of the insulating layer 130 along the second direction D2, between the second sidewalls 152-2 of the via structure 152 and the insulating layer 108 along the first direction D1, and between a bottom surface of the via structure 152 and the first metallization feature 110. In some embodiments, the barrier layer (not shown) is disposed between the sidewalls of the second metallization feature 150 and the insulating layer 114. In some embodiments, the barrier layer (not shown) is disposed between the sidewalls of the second metallization feature 150 and the third portion 136 of the insulating layer 130. In some embodiments, the barrier layer is disposed between the sidewalls of the second metallization feature 150 and the dielectric structure 140, though not shown.

Figure 2:
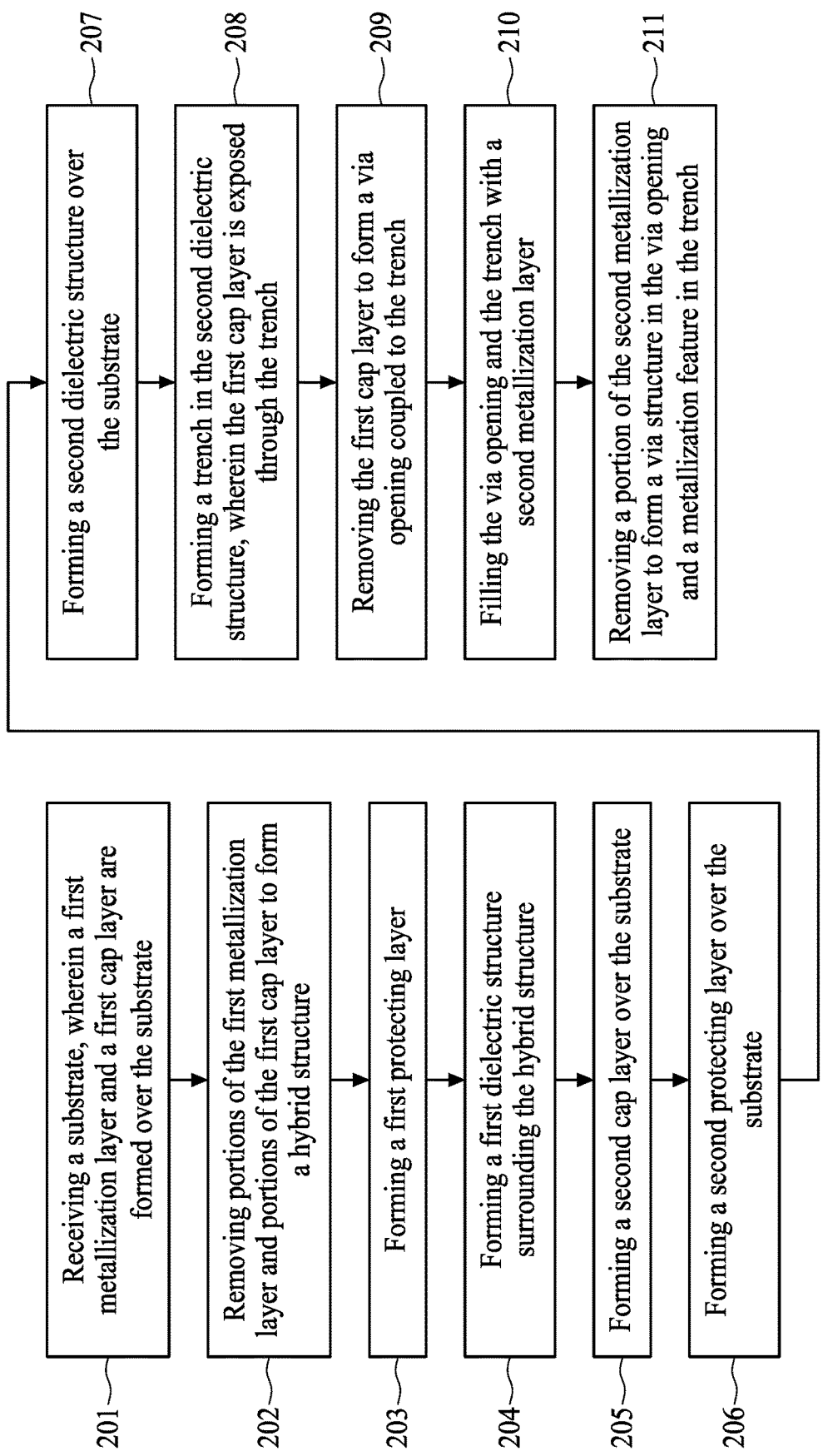
FIG. 2 is a flowchart of a method for forming a semiconductor structure according to various aspects of the present disclosure.

FIG. 2 is a flowchart representing a method for forming a semiconductor structure 20 according to aspects of the present disclosure. In some embodiments, the method for forming the semiconductor structure 20 includes a number of operations (201, 202, 203, 204, 205, 206, 207, 208, 209, 210 and 211). The method for forming the semiconductor structure 20 will be further described according to one or more embodiments. It should be noted that the operations of the method for forming the semiconductor structure 20 may be rearranged or otherwise modified within the scope of the various aspects. It should further be noted that additional processes may be provided before, during, and after the method 20, and that some other processes may be only briefly described herein. In some embodiments, the method for forming the semiconductor structure 20 can be used to form a BEOL interconnect structure of a semiconductor structure. In some embodiments, the method for forming the semiconductor structure 20 can be used to form the semiconductor structure 100 as described above; therefore, same elements in FIGS. 1A and 1B and the following figures are indicated by the same numerals, and repeated descriptions of such elements are omitted for brevity.

Figure 5:
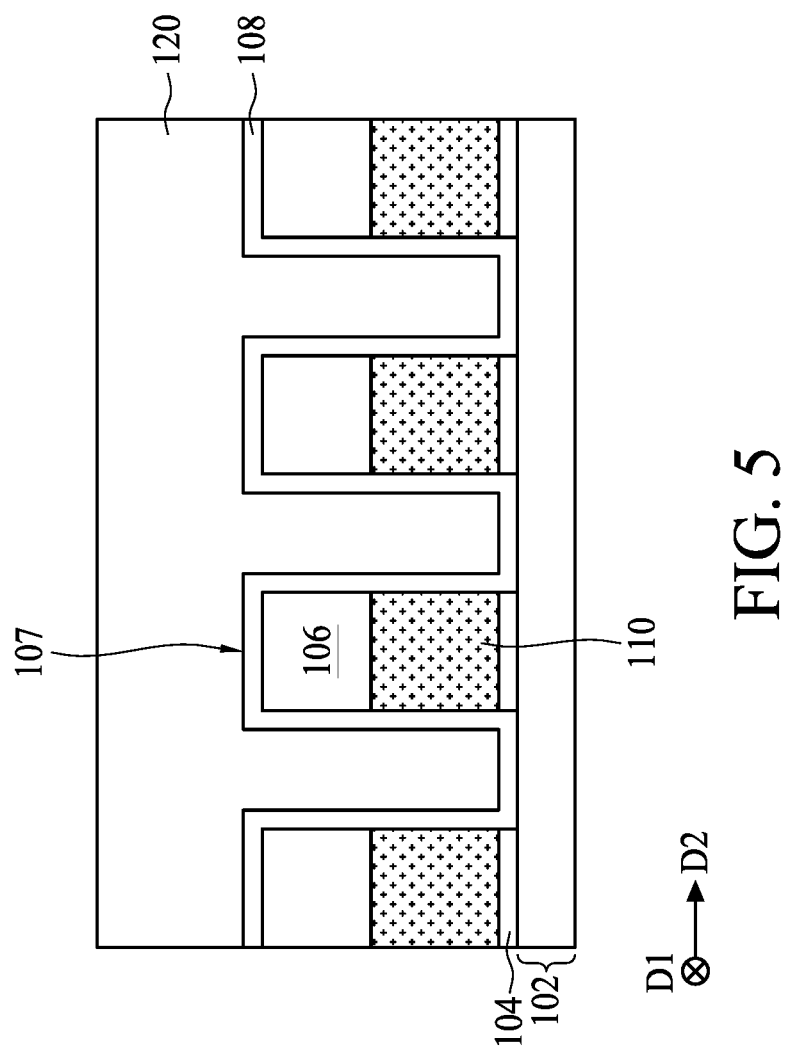
Figure 6B:
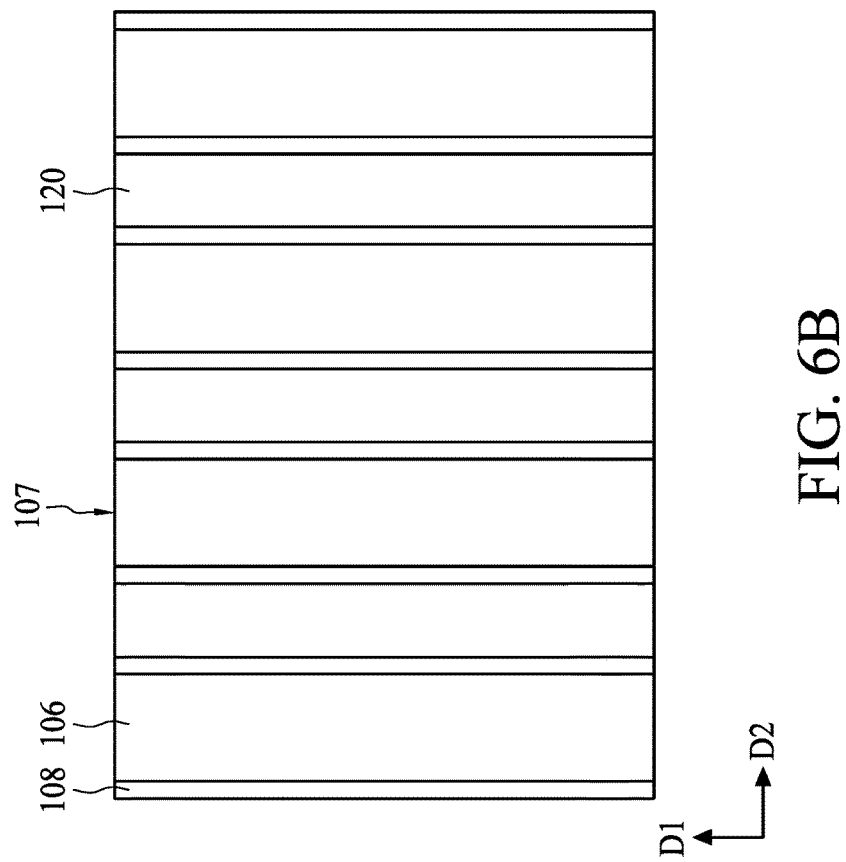
FIGS. 6B, 7B and 10B are top views of FIGS. 6A, 7A and 10A, respectively.

FIGS. 3, 4, 5, 6A, 7A, 8, 9, 10A, 11A, 12A, 13A, 14A and 15A are schematic drawings illustrating various stages in a method for forming a semiconductor structure according to aspects of one or more embodiments of the present disclosure. Further, FIGS. 6B, 7B and 10B are top views of FIGS. 6A, 7A and 10A, respectively. FIGS. 11B, 12B, 13B, 14B and 15B are cross-sectional views taken along a line I-I' of FIGS. 11A, 12A, 13A 14A and 15A, respectively.

Referring to FIG. 3, in operation 201, a substrate is received. As described above. FEOL devices (not shown) can be formed in and/or over the substrate. Further, a layer of MEOL interconnect structure 102 can be formed over the substrate. In some embodiments, a glue layer 104 can be formed over the substrate and the layer of MEOL interconnect structure 102. A thickness of the glue layer 104 and a material used to form the glue layer 104 can be similar to those described above; therefore, repeated descriptions of such details are omitted for brevity. In some embodiments, a first metallization layer 105 is formed over the substrate and the layer of MEOL interconnect structure 102. The first metallization layer 105 can be attached to and coupled to the layer of MEOL interconnect structure 102 by the glue layer 104. Materials used to form the first metallization layer 105 can be similar to those of the first metallization feature 110; therefore, the repeated descriptions of such details are omitted for brevity.

Still referring to FIG. 3, in some embodiments, a first cap layer 106 is formed over the first metallization layer 105. The first cap layer 106 and the first metallization layer 105 include different materials. The first cap layer 106 may include a semiconductor material, an insulating material, or a conductive material. For example, the first cap layer 106 can include silicon, silicon oxide, silicon nitride, silicon carbon nitride, silicon oxynitride, silicon oxy-carbide, metal nitrides, metal carbides, metal oxide, metals, or a combination thereof. It should be noted that when the first cap layer 106 includes conductive materials such as metals, metal nitrides, or a combination thereof, the first cap layer 106 and the first metallization layer 105 include different metal materials. In some embodiments, a thickness of the first cap layer 106 is between approximately 30 angstroms and approximately 1000 angstroms, but the disclosure is not limited thereto.

In operation 202, portions of the first metallization layer 105 and portions of the first cap layer 106 are removed to form at least a hybrid structure 107 over the substrate and the layer of MEOL interconnect structure 102. In some embodiments, portions of the glue layer 104 are also removed. In some embodiments, the removal of the portions of the first metallization layer 105 and the portions of the first cap layer 106 can include a dry etching. In some embodiments, the removal of the portions of the first metallization layer 105 and the portions of the first cap layer 106 can include a reactive ion etching (RIE), such as a metal RIE. In such embodiments, the metal RIE can use inductively-coupled plasma (ICP), capacitively coupled plasma (CCP), or remote plasma. An etching gas used in the metal RIE can include methane ($CH_4$), methyl fluoride (or fluoromethane) ($CH_3F$), difluoromethane ($CH_2F_2$), trifluoromethane ($CHF_3$), octafluorocyclobutane ($C_4F_8$), hexafluoro-1,3-butadiene ($C_4F_6$), carbon tetrafluoride (or tetrafluoromethane) ($CF_4$), hydrogen ($H_2$), hydrogen bromide (HBr), carbon monoxide (CO), carbon dioxide ($CO_2$) oxygen ($O_2$), boron trichloride ($BCl_3$), chlorine ($Cl_2$), nitrogen ($N_2$), helium (He), neon (Ne), argon (Ar) and other suitable gases. The metal RIE can be performed at a pressure between approximately 0.2 mTorr and approximately 120 mTorr. The metal RIE can be performed at a temperature between approximately 0° C. and approximately 200° C. The metal RIE can be performed with a power between approximately 50 W and approximately 3000 W and a bias between approximately 0V and approximately 1200V. In some embodiments, a wet clean removal can be performed with the metal RIE.

Accordingly, the hybrid structure 107 is formed over the substrate and the layer of MEOL interconnect structure 102. The hybrid structure 107 can include a first metallization feature 110 (which can be referred to as the (N−1)th metal layer M(n−1)), and the first cap layer 106, as shown in FIG. 4. In other words, the first metallization feature 110 is between the first cap layer 106 and the substrate (and the layer of MEOL interconnect structure 102). Further, the hybrid structure 107 extends along the first direction D1. In some embodiments, when a plurality of hybrid structures 107 are formed over the substrate, the hybrid structures 107 are separated from each other by a recess 109, as shown in FIG. 4. Additionally, portions of the layer of MEOL interconnect structure 102 may be exposed through a bottom of the recess 109. Further, the hybrid structures 107 are arranged along the second direction D2. As mentioned above, the first direction D1 and the second direction D2 are different. In some embodiments, the first direction D1 and the second direction D2 are perpendicular, but the disclosure is not limited thereto.

In operation 203, an insulating layer serving as a first protecting layer 108 is formed. Referring to FIG. 5, in some embodiments, the first protecting layer 108 is formed over the substrate and the layer of MEOL interconnect structure 102. The first protecting layer 108 covers sidewalls and a top surface of the hybrid structure 107. Further, the first protecting layer 108 covers sidewalls of the first metallization feature 110, such that the first metallization feature 110 can be protected from external impact. In some embodiments, the first protecting layer 108 is further in contact with the layer of MEOL interconnect structure 102. The first protecting layer 108 includes insulating materials. In some embodiments, the first protecting layer 108 includes silicon, silicon oxide, silicon nitride, silicon carbide, silicon oxynitride, silicon oxy-carbide, metal nitrides, metal oxides, or a combination thereof. Further, the material used to form the first protecting layer 108 is different from that of the first cap layer 106. In some embodiments, a thickness of the first protecting layer 108 is between approximately 5 angstroms and approximately 200 angstroms, but the disclosure is not limited thereto.

In operation 204, a dielectric structure 120 is formed to surround the hybrid structure 107. In some embodiments, the dielectric structure 120 surrounding the hybrid structure 107 can be formed by operations described below, but the disclosure is not limited thereto.

Referring to FIG. 5, the dielectric structure 120 is formed over the substrate and the layer of MEOL interconnect structure 102. The dielectric structure 120 is formed over the hybrid structure 107. Further, the recess 109 that separates the hybrid structures 107 is filled with the dielectric structure 120. Therefore, the hybrid structure 107 is embedded in the dielectric structure 120. In some embodiments, the dielectric structure 120 includes a low-k dielectric material. For example, the dielectric structure 120 can include silicon carbide, silicon oxide, silicon nitride, silicon carbon nitride, silicon oxynitride, silicon oxygen carbon nitride, or a combination thereof. It should be noted that when the first protecting layer 108 is formed, the material chosen to form the first protecting layer 108 is different from that of the dielectric structure 120. In some embodiments, the dielectric structure 120 can be formed using spin-on coating, chemical vapor deposition (CVD), atomic layer deposition (ALD), physical vapor deposition (PVD) or other suitable approaches. In some embodiments, a thickness of the dielectric structure 120 is between approximately 30 angstroms and approximately 3000 angstroms, but the disclosure is not limited thereto.

Figure 6A:
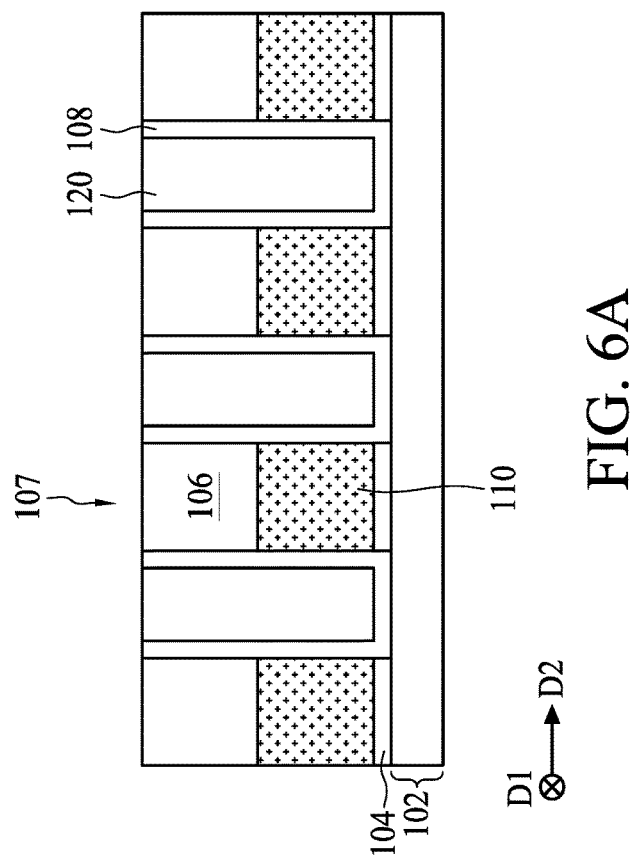
Figure 7B:
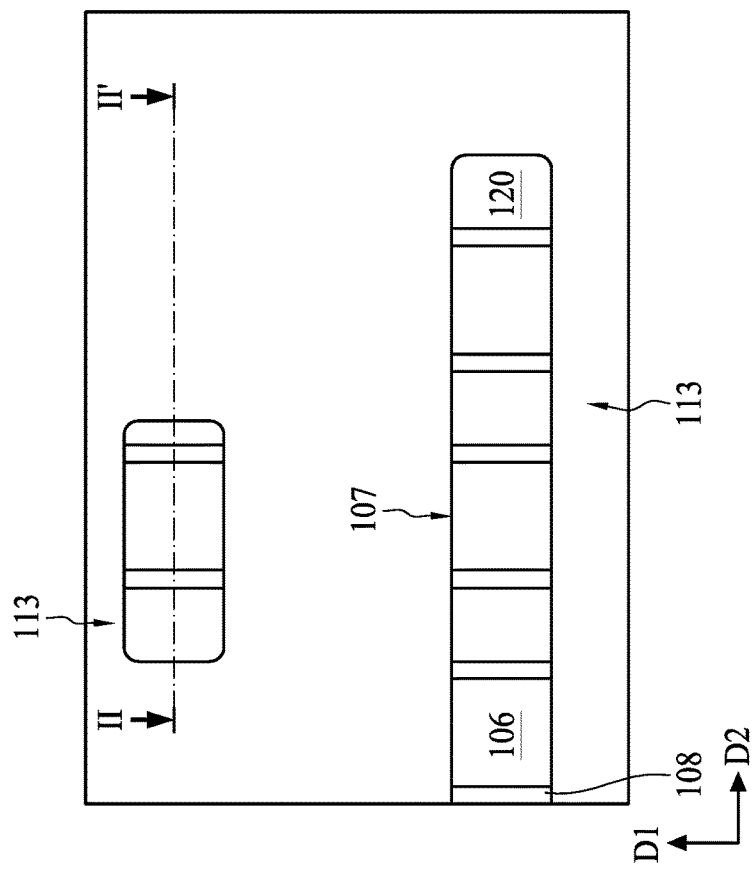

Referring to FIGS. 6A and 6B, a portion of the dielectric structure 120 and a portion of the first protecting layer 108 are removed to expose the hybrid structure 107. Further, the first cap layer 106 of the hybrid structure 107 is exposed. In some embodiments, a top surface of the dielectric structure 120 and a top surface of the hybrid structure 107 (i.e., a top surface of the first cap layer 106) are aligned with each other. In some embodiments, a topmost surface of the protecting layer 108 is aligned with the top surface of the dielectric structure 120 and the top surface of the first cap layer 106, as shown in FIG. 6A. In some embodiments, the hybrid structures 107 and the dielectric structures 120 extend along the first direction D1. In some embodiments, the hybrid structures 107 and the dielectric structure 120 are alternately arranged along the second direction D2, as shown in FIG.

6B. In some embodiments, the removal of the portion of the dielectric structure 120 and the portion of the first protecting layer 108 can be performed by a chemical mechanical polishing (CMP) operation, but the disclosure is not limited thereto. In some embodiments, a thickness of the first cap layer 106 after the CMP operation can be used to define a height of a via structure, which will be described below.

In operation 205, an insulating layer serving as a second cap layer 114 is formed over the substrate, or over the hybrid structure 107. In some embodiments, the second cap layer 114 can be formed by following operations, but the disclosure is not limited thereto.

Figure 7A:
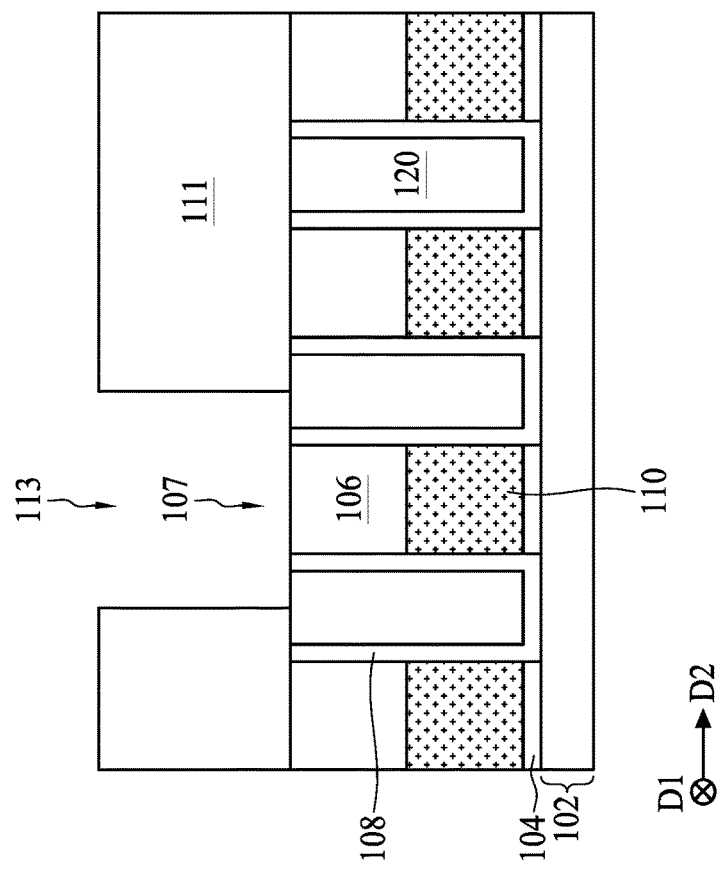

Referring to FIGS. 7A and 7B, in some embodiments, a patterned sacrificial layer 111 is formed over the hybrid structure 107 and the dielectric structure 120. The patterned sacrificial layer 111 has at least an opening 113 for defining dimensions and locations of the second cap layer 114. Further, a portion of the dielectric structure 120 and a portion of the first cap layer 106 of the hybrid structure 107 are exposed through the opening 113. As shown in FIG. 7B, in some embodiments, the opening 113 can have a dimension greater than that of a via opening required in a BEOL interconnect structure. Further, the opening 113 can include a slot profile. For example, the opening 113 can have along side and a short side as shown in FIG. 7B. Further, the long side of the opening 113 may extend along a direction different from the first direction D1. For example, the opening 113 may extend along the second direction D2, but the disclosure is not limited thereto. In some embodiments, the patterned sacrificial layer 111 can include a photoresist, but the disclosure is not limited thereto.

Figure 8:
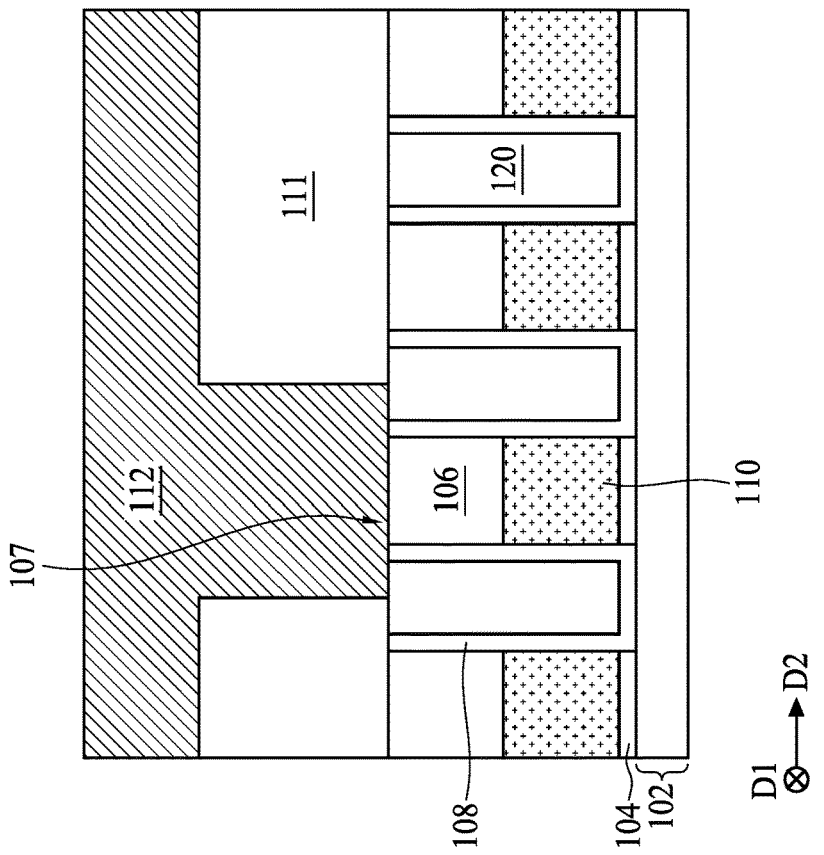

Referring to FIG. 8, in some embodiments, the opening 113 is filled with a reverse material 112. In some embodiments, the reverse material 112 includes insulating materials. In some embodiments, the reverse materials 112 can include silicon, silicon oxide, silicon nitride, silicon carbon nitride, silicon oxynitride, silicon oxy-carbide, silicon carbide, or combinations thereof. Further, the reverse material 112 includes the material different from that of the first cap layer 106. In some embodiments, the reverse material 112 can be formed by spin-on coating, CVD, ALD, PVD or another suitable method. In some embodiments, a thickness of the reverse material 112 can be between approximately 30 angstroms and approximately 1000 angstroms, but the disclosure is not limited thereto.

Figure 9:
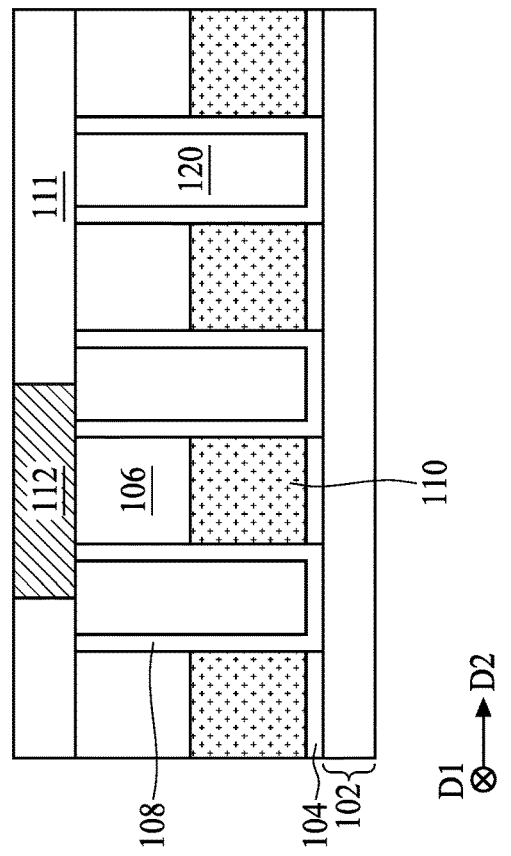
Figure 10B:
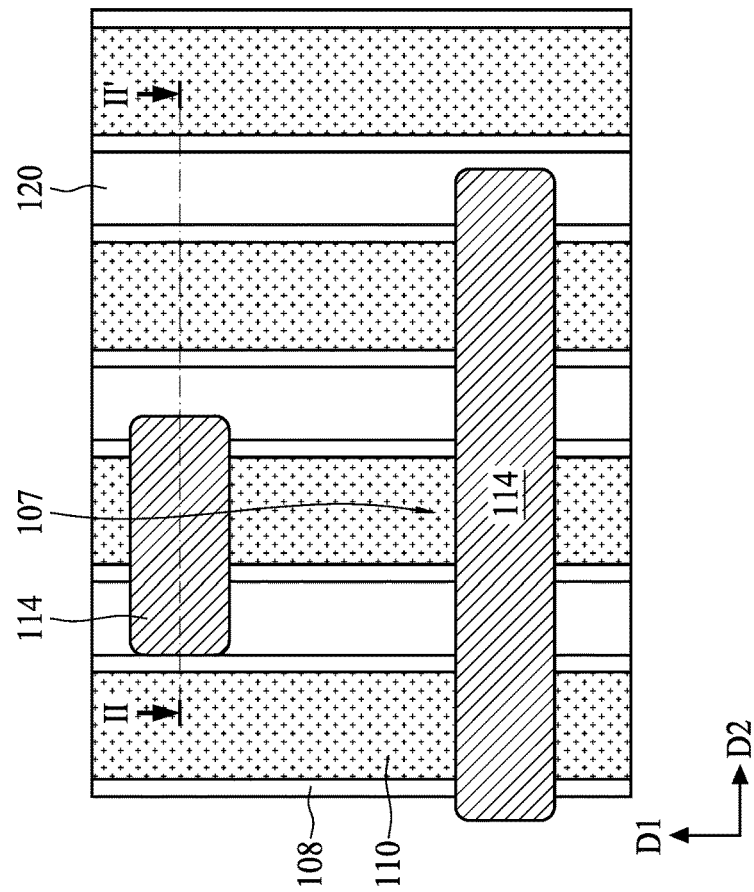

Referring to FIG. 9, in some embodiments, a planarization is performed to remove a portion of the reverse material 112 and a portion of the patterned sacrificial layer 111. Accordingly, a top surface of the remaining patterned sacrificial layer 111 and a top surface of the remaining reverse material 112 are aligned with each other after the planarization.

Figure 10A:
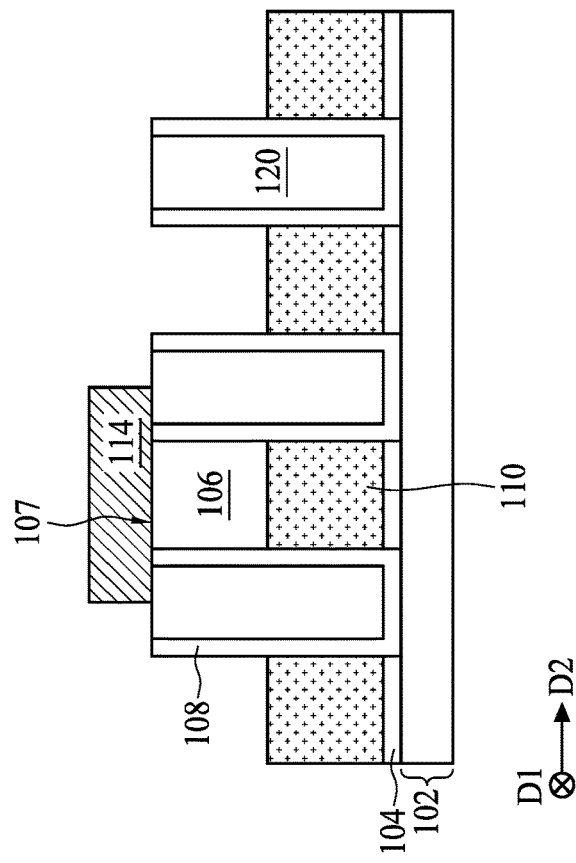

Referring to FIGS. 10A and 10B, the remaining patterned sacrificial layer 111 is removed. Consequently, the second cap layer 114 is formed over the hybrid structure 107 and the dielectric structure 120. Further, the hybrid structure 107 extends along the first direction D1, and the second cap layer 114 extends along a second direction D2, as shown in FIG. 10B. Additionally, a thickness of the second cap layer 114 can be between approximately 5 angstroms and approximately 200 angstroms, but the disclosure is not limited thereto. In some comparative approaches, when the thickness of the second cap layer 114 is less than 5 Angstroms, there may be increased difficulty in selectively removing the second cap layer 114 from the first cap layer 106, even though the first cap layer 106 and the second cap layer 114 include different materials. In some comparative approaches, when the thickness of the second cap layer 114 is greater than 200 angstroms, there may be increased difficulty in selectively removing the second cap layer 114 from the dielectric structure 120, which will be discussed below.

Still referring to FIGS. 10A and 10B, in some embodiments, portions of the first cap layer 106 exposed through the second cap layer 114 are removed. In some embodiments, an overlapping region formed by the second cap layer 114 and the first cap layer 106 defines a location and a dimension of a via opening to be formed. In other words, the location of the via opening is defined by the overlapping regions of the first and second cap layers 106 and 114, instead of by photolithography. Accordingly, the overlay control issue and overlay shift issue induced by the photolithography can be mitigated.

Figure 11A:
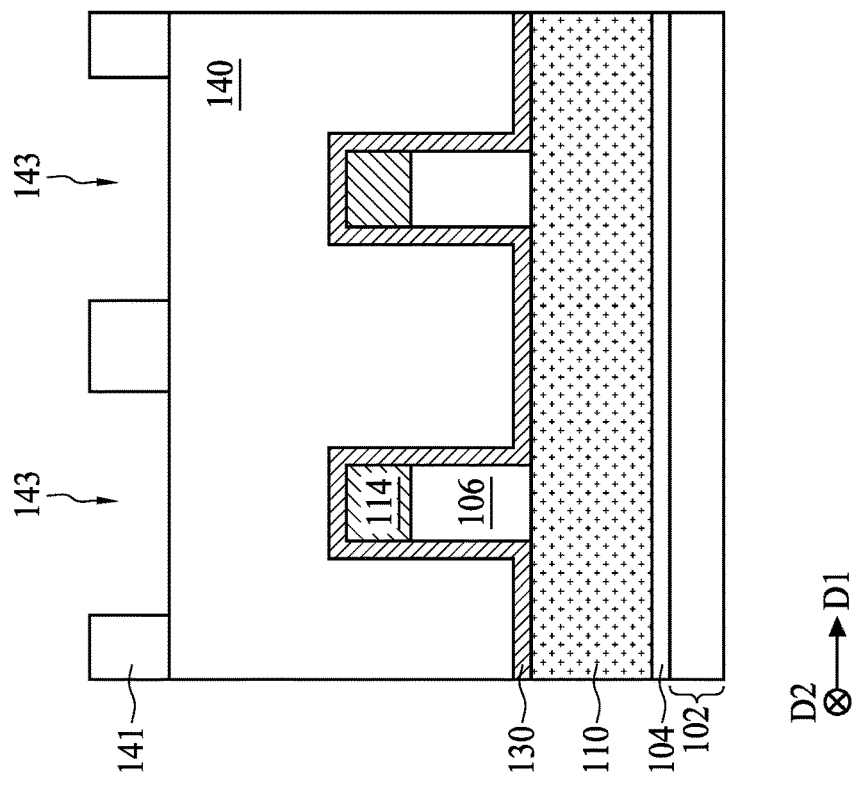
Figure 11B:
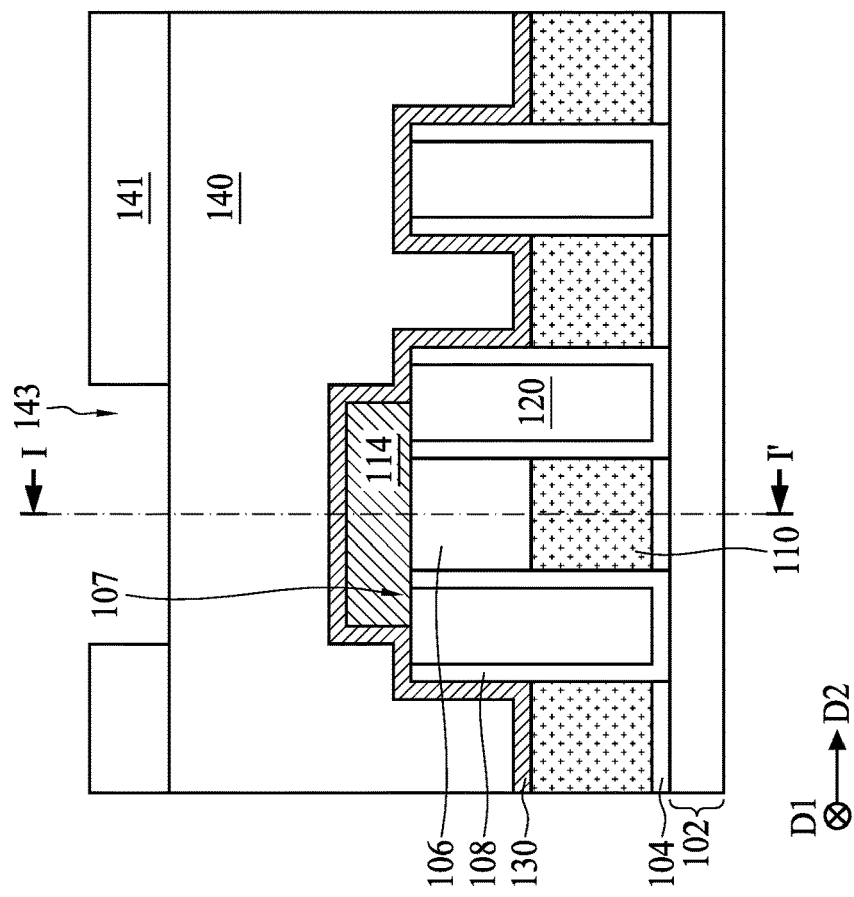
FIGS. 11B, 12B, 13B, 14B and 15B are cross-sectional views taken along a line I-I' of FIGS. 11A, 12A, 13A, 14A and 15A, respectively.

In operation 206, a second protecting layer 130 is formed over the substrate. Referring to FIGS. 11A and 11B, the second protecting layer 130 blanketly covers elements over the substrate and the layer of MEOL interconnect structure 102. In some embodiments, the second protecting layer 130 includes an insulating material. In some embodiments, the second protecting layer 130 includes silicon, silicon oxide, silicon nitride, silicon carbide, silicon oxynitride, silicon oxy-carbide, metal nitrides, metal oxides, or a combination thereof. In some embodiments, the second protecting layer 130 and the first protecting layer 108 can include the same material. In some alternative embodiments, the second protecting layer 130 and the first protecting layer 108 can include different materials. In some embodiments, the second protecting layer 130 and the dielectric structure 120 include different materials. In some embodiments, the second protecting layer 130 includes the material different from that of a dielectric structure to be formed, which will be described below. In some embodiments, a thickness of the second protecting layer 130 can be between approximately 5 angstroms and approximately 200 angstroms, but the disclosure is not limited thereto. In some comparative approaches when the thickness of the second protecting layer 130 is less than 5 angstroms, it may be found that the second protecting layer 130 is discontinuously formed, thus the second protecting layer 130 may not provide sufficient protection. In some alternative approaches when the thickness of the second protecting layer 130 is greater than 200 angstroms, an unwanted seam issue may occur between the first metallization features 110 at small pitch patterns. It should be noted that along the first direction D1, the second protecting layer 130, which is over the first metallization feature 110 and may be in contact with the first metallization feature 110, protects the first metallization feature 110 from external impacts.

In some embodiments, a patterned dielectric structure 140 can be formed over the substrate or the layer of MEOL interconnect structure 102. In some embodiments, the forming of the patterned dielectric structure can include operations described below, but the disclosure is not limited thereto.

In operation 207, a dielectric structure 140 is formed over the substrate. Referring to FIGS. 11A and 11B, the dielectric structure 140 is formed to cover the second protecting layer 130. Materials used to form the dielectric structure 140 can be similar to those of the dielectric structure 120; therefore, repeated descriptions of such details are omitted for brevity. In some embodiments, a thickness of the dielectric structure 140 can be between approximately 50 angstroms and approximately 3000 angstroms, but the disclosure is not limited thereto. After the forming of the dielectric structure 140, a patterned hard mask 141 can be formed. The patterned hard mask 141 can include a single-layered structure or a multi-layered structure. In some embodiments, the patterned hard mask 141 includes silicon, silicon oxides, silicon nitrides, silicon carbon nitrides, silicon oxynitrides, silicon oxy-carbides, metal nitrides, metal carbides, metal oxide, metals, or a combination thereof. In some embodiments, a thickness of the hard mask 141 can be between approximately 30 angstroms and approximately 1000 angstroms, but the disclosure is not limited thereto. In some embodiments, the patterned hard mask 141 includes at least an opening 143, as shown in FIGS. 11A and 11B. The opening 143 defines a dimension and a location of a trench to be formed.

Figure 12B:
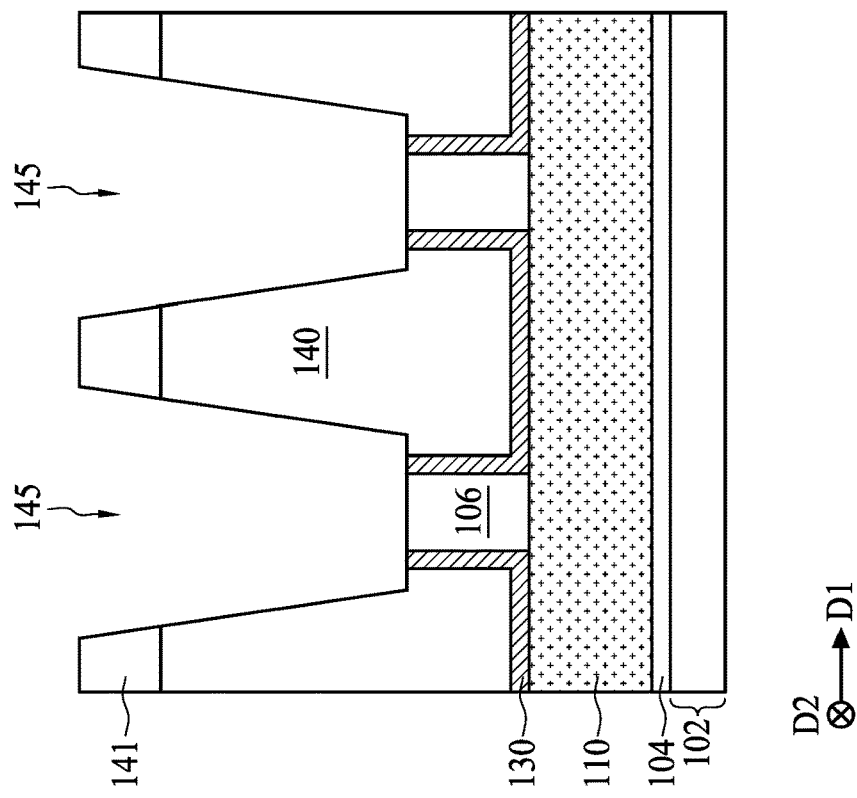
Figure 12A:
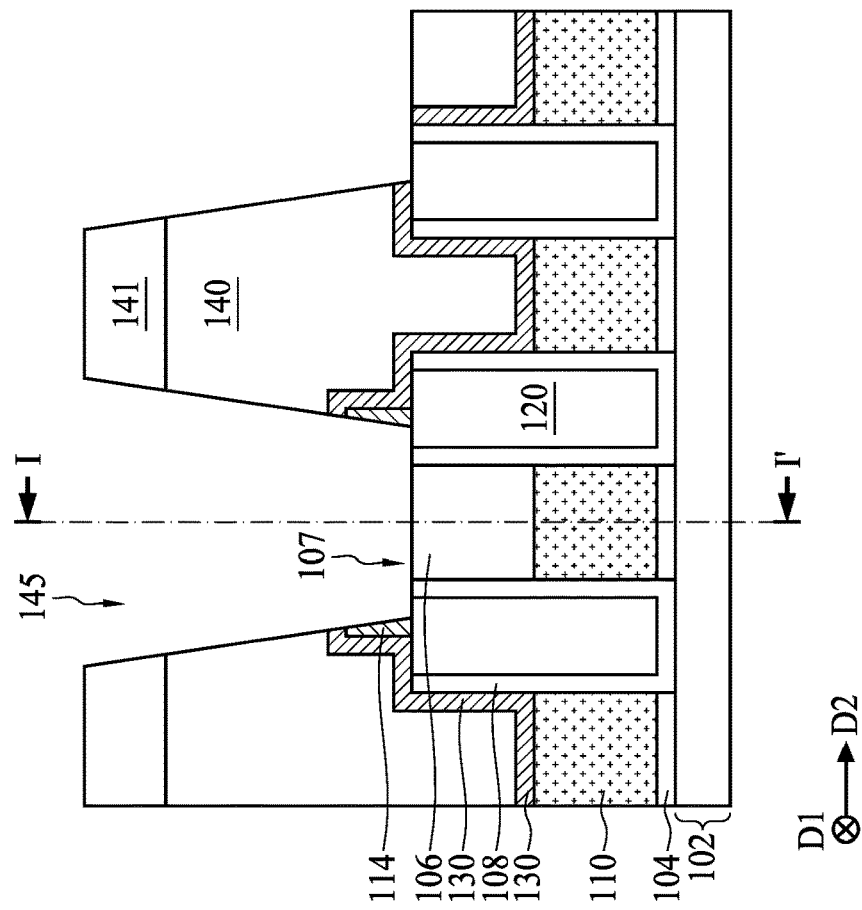

In operation 208, a trench 145 is formed in the dielectric structure 140. Referring to FIGS. 12A and 12B, in some embodiments, an etching operation can be performed to remove a portion of the dielectric structure 140, a portion of the second protecting layer 130 and a portion of the second cap layer 114 through the opening 143. Accordingly, the trench 145 is formed in the dielectric structure 140, the second protecting layer 130 and the second cap layer 114. Further, the first cap layer 106 is exposed through a bottom of the trench 145. In some embodiments, the etching operation includes a dry etching, such as a plasma etching. An etching selectivity between the dielectric structure 140 and the second cap layer 114 is tunable. In some embodiments, the etching selectivity between the dielectric structure 140 and the second cap layer 114 can be modified between 0.1 and 100 by adjusting knobs or variables in the plasma etching. The variables in the plasma etching include gas ratio, power, bias, pressure, temperature, etc. In some embodiments, an etching selectivity between the dielectric structure 140 and the first cap layer 106 is tunable. In some embodiments, the etching selectivity between the dielectric structure 140 and the first cap layer 106 can be modified between 0.1 and 100 by adjusting the variables in the plasma etching. As mentioned above, the thickness of the second cap layer 114 is between approximately 5 angstroms and approximately 200 angstroms. In comparative approaches when the thickness of the second cap layer 114 is less than 5 angstroms, the etching selectivity required between the second cap layer 114 and the first cap layer 106 is increased because the second cap layer 114 is so thin that it is easily removed, and the first cap layer 106 exposed through the bottom of the trench 145 must withstand the etching. In some comparative approaches, when the thickness of the second cap layer 114 is greater than 200 angstroms, there may be increased difficulty for forming the trench 145 by selectively removing the second cap layer 114 from the dielectric structure 120 because the dielectric structure 120 may be consumed during the removing of the second cap layer 114. Therefore, higher etching selectivity for the second cap layer 114 and the dielectric structure 120 is required to prevent dielectric recess, which may cause rugged trench bottom and decrease the via height. Thus, an etchant choice is limited in such comparative approaches.

Accordingly, a patterned dielectric structure 140 is obtained. As shown in FIGS. 12A and 12B, the patterned second dielectric structure 140 includes the trench 145 exposing the first cap layer 106.

Figure 13A:
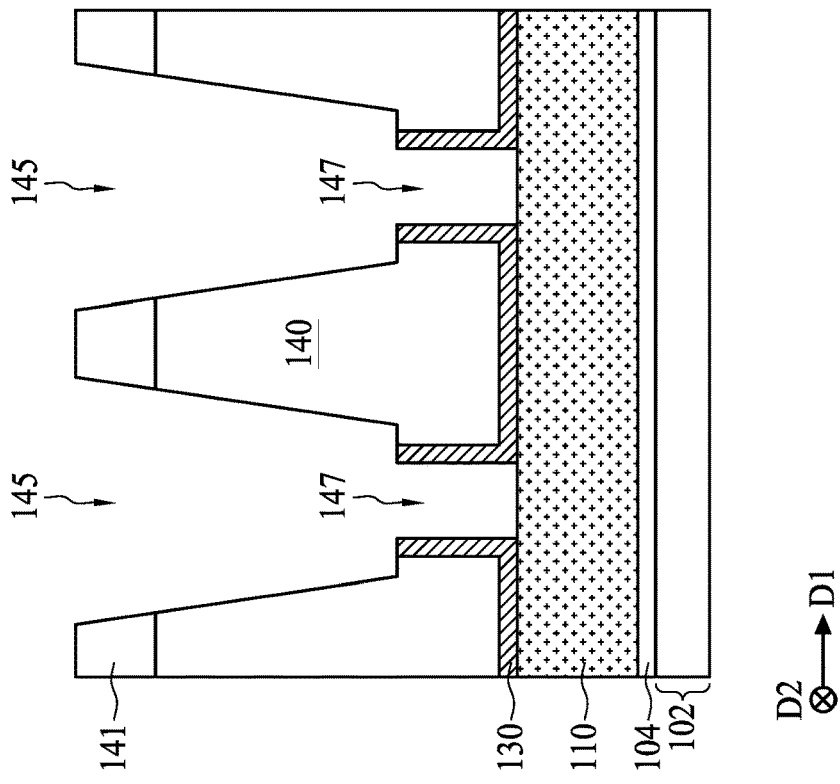
Figure 13B:
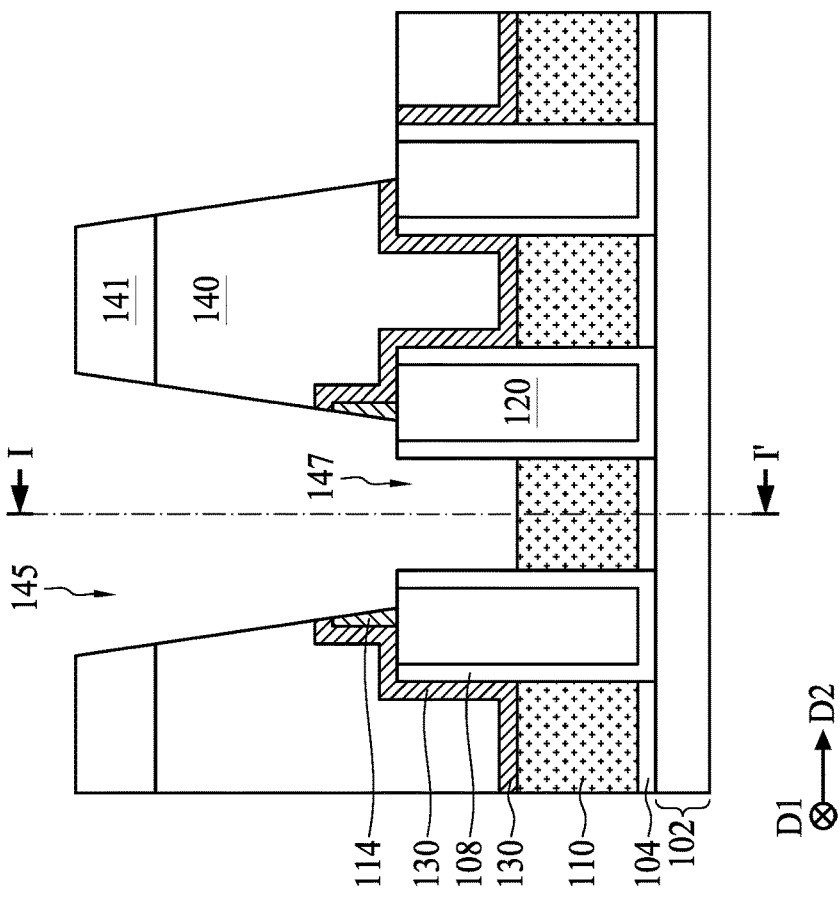

In operation 209, the first cap layer 106 exposed through the trench 145 is removed to form a via opening 147. As shown in FIGS. 13A and 13B, the via opening 147 is coupled to the trench 145. In some embodiments, the removal of the first cap layer 106 can include a wet etching. In some embodiments, the removal of the first cap layer 106 can include a dry etching. For example, the removal of the first cap layer 106 can include a plasma etching, an non-plasma chemical gas etching, or other suitable etching approaches. As mentioned above, the etching selectivity between the dielectric structure 140 and the first cap layer 106 can be modified between 0.1 and 100 by adjusting the variables in the plasma etching. Therefore, consumption of the dielectric structure 140 can be reduced during the removal of the first cap layer 106. Consequently, the via opening 147 coupled to the trench 145 obtained. As shown in FIGS. 13A and 13B, the first metallization feature 110 may be exposed through a bottom of the via opening 147. Further, along the first direction D1, the first protecting layer 108 is exposed through a portion of sidewalls of the via opening 147, while the second protecting layer 130 is exposed though another portion of the sidewalls of the via opening 147 along the second direction D2. In some embodiments, a width of the via opening 147 can be between approximately 5 nanometers and approximately 300 nanometers. In some embodiments, a corner-rounding operation can be performed after the forming of the via opening 147. In such embodiments, a plasma etching and a non-plasma chemical gas etching can be performed. The corner-rounding operation can be performed to further widen a top opening of the trench 145 and/or a top opening of the via opening 147, and thus a gap-filling result can be improved.

In some embodiments, a second metallization feature 150 is formed in the trench 145 and a via structure 152 is formed in the via opening 147. In some embodiments, the forming of the second metallization feature 150 and the via structure 152 can include operations described below, but the disclosure is not limited thereto.

Figure 14B:
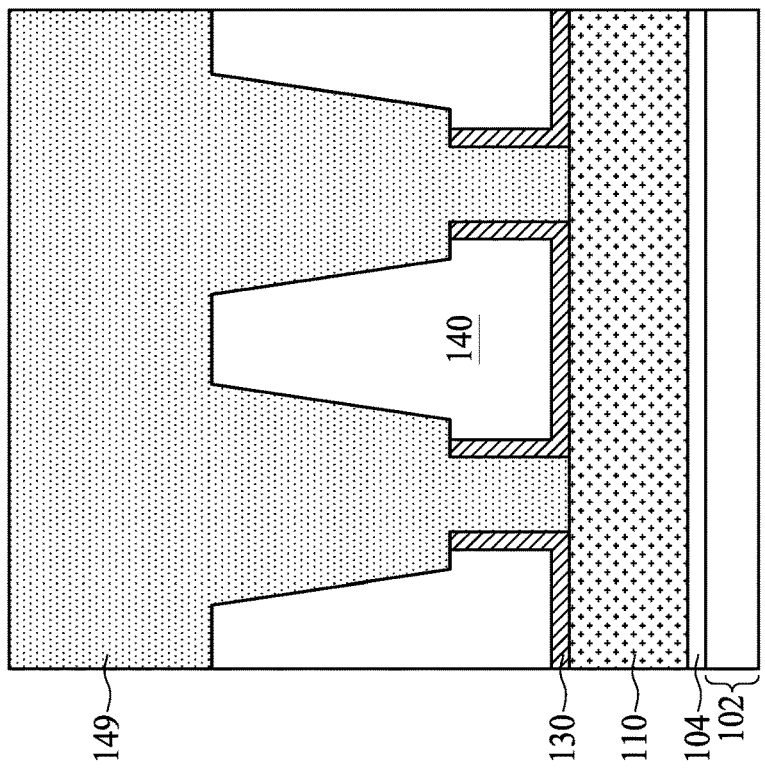
Figure 14A:
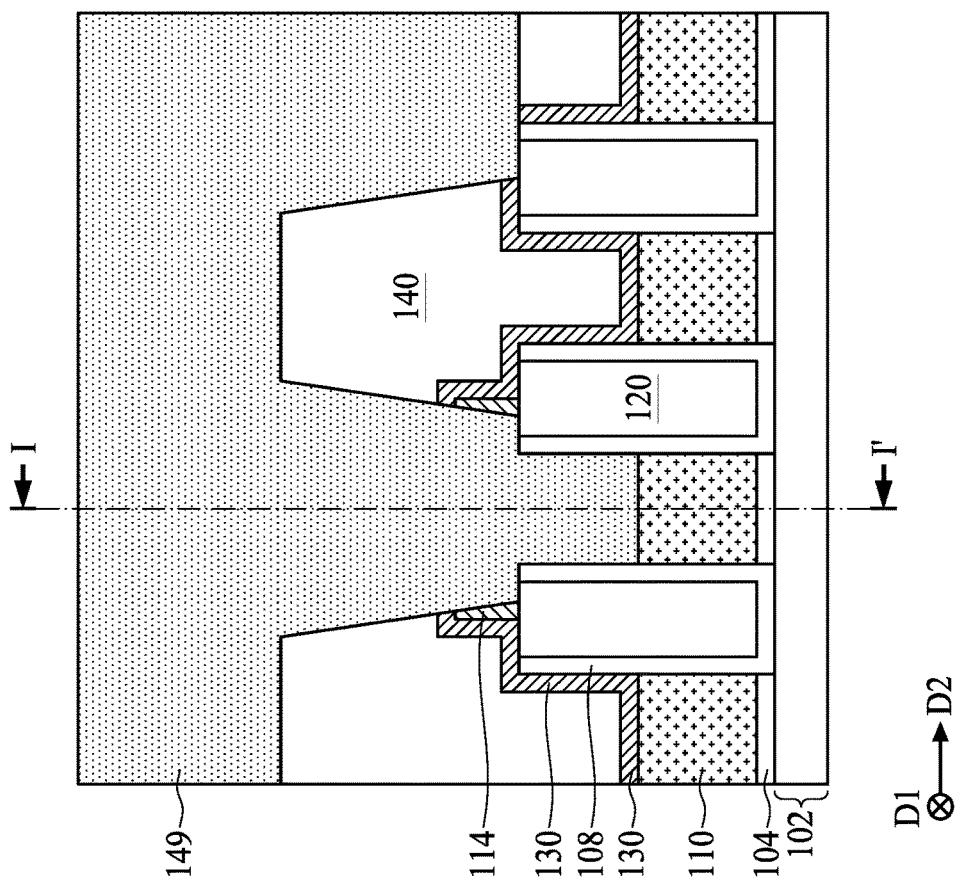

In operation 210, the via opening 147 and the trench 145 are filled with a second metallization layer 149, as shown in FIGS. 14A and 14B. In some embodiments, a barrier layer (not shown) can be formed prior to the forming of the second metallization layer 149. In some embodiments, the second metallization layer 149 can include a material similar to that of the first metallization layer 105; therefore, those details are omitted for brevity.

Figure 15B:
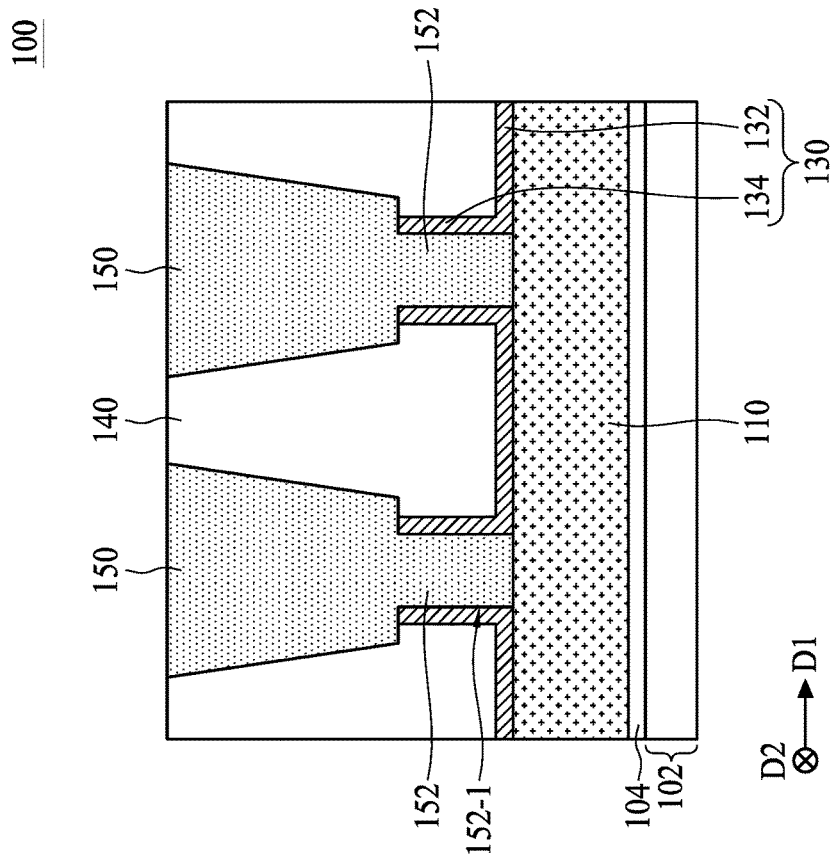
Figure 15A:
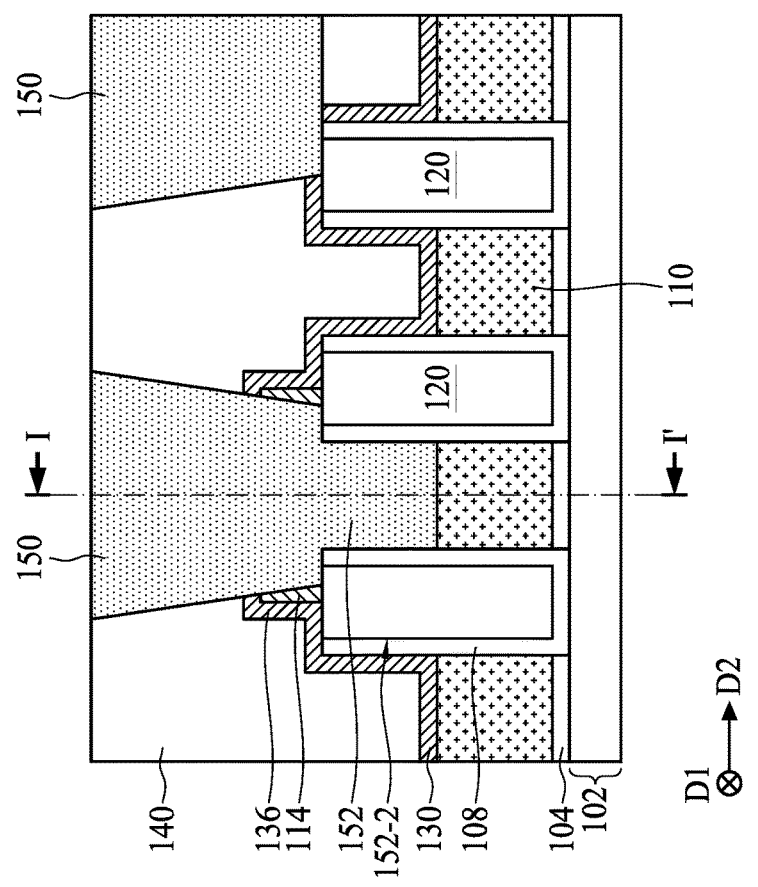

In operation 211, a portion of the second metallization layer 149 is removed to form a second metallization feature 150 in the trench 145 and to form the via structure 152 in the via opening 147. In some embodiments, a planarization operation such as a CMP operation can be performed to remove the portion of the second metallization layer 149, but the disclosure is not limited thereto. Accordingly, a semiconductor structure 100 can be obtained, as shown in FIGS. 15A and 15B.

According to some embodiments, the method for forming the semiconductor structure includes etch-free via-forming operations. As described above, the via opening can be defined by an overlapping region of the second cap layer and the first cap layer; therefore, the via opening can be formed by removing the first and second cap layers after the forming of the patterned dielectric structure. In other words, an ESL structure for etching the via opening is not required. The capacitance issue caused by the ESL structure in the semiconductor structure can be mitigated. Further, because the via opening is defined by the overlapping region of the second cap layer and the first cap layer, a photolithography operation for defining the dimension and location of the via opening is not required. Thus, overlay shift issue and tiger-tooth issue can both be mitigated, and overlay control can be simplified. Further, because the via formation is separated from the trench etching, the etching of the trench is simplified. Consequently, the device performance of the semiconductor structure can be improved.

In some embodiments, a semiconductor structure is provided. The semiconductor structure includes a first metallization feature, a first dielectric structure over the first metallization feature, a second metallization feature embedded in the first dielectric structure, a via structure between the first metallization feature and the second metallization feature, and a first insulating layer between the first dielectric structure and the first metallization feature, and between the first dielectric structure and the via structure. In some embodiments, the first metallization feature extends along a first direction, and the second metallization feature extends along a second direction different from the first direction. In some embodiments, the first insulating layer covers first sidewalls of the via structure along the second direction.

In some embodiments, a method for forming a semiconductor structure is provided. The method includes following operations. A substrate is received. A first dielectric structure and a hybrid structure are formed over the substrate. In some embodiments, the hybrid structure includes a first cap layer and a first metallization feature between the first cap layer and the substrate. A second cap layer is formed over the hybrid structure. A first insulating layer is formed over the substrate. A patterned second dielectric structure is formed over the substrate. The patterned second dielectric structure includes a trench exposing the first cap layer. The first cap layer is removed to form a via opening exposing the first metallization feature. A second metallization feature is formed in the trench and a via structure is formed in the via opening.

In some embodiments, a method for forming a semiconductor structure is provided. The method includes following operations. A first metallization layer and a first cap layer are formed over a substrate. In some embodiments, the first metallization and the first cap layer include different materials. Portions of the first metallization layer and portions of the first cap layer are removed to form at least a hybrid structure over the substrate. A first dielectric structure surrounding the hybrid structure is formed. A second cap layer is formed over the hybrid structure. The second cap layer includes a material different from a material of the first cap layer. A protecting layer is formed over the substrate. The protecting layer includes a material different from a material of the first dielectric structure. A second dielectric structure is formed over the substrate. A trench is formed in the second dielectric structure, the protecting layer and the second cap layer. The first cap layer is removed to form a via opening. The via opening and the trench are filled with a second metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   receiving a substrate, wherein a first dielectric structure and a hybrid structure are formed over the substrate, and the hybrid structure comprises a first cap layer over the substrate and a first metallization feature between the first cap layer and the substrate;
   forming a second cap layer over the hybrid structure, wherein the forming of the second cap layer comprises:
      forming a patterned sacrificial layer having an opening over the substrate;
      filling the opening with a reverse material; and
      removing the patterned sacrificial layer and a portion of the reverse material to form the second cap layer;
   forming a first insulating layer over the substrate;
   forming a patterned second dielectric structure over the substrate, wherein the patterned second dielectric structure comprises a trench exposing the first cap layer;
   removing the first cap layer to form a via opening exposing the first metallization feature; and
   forming a second metallization feature in the trench and a via structure in the via opening.

2. The method of claim 1, further comprising:
   forming a metallization layer and the first cap layer over the substrate;
   removing portions of the metallization layer and portions of the first cap layer to form the hybrid structure; and
   forming the first dielectric structure surrounding the hybrid structure.

3. The method of claim 2, further comprising:
   forming a second insulating layer over the substrate and the hybrid structure prior to the forming of the first dielectric structure; and
   removing a portion of the first dielectric structure and a portion of the second insulating layer to expose the first cap layer.

4. The method of claim 1, wherein the hybrid structure extends along a first direction, and the second cap layer extends along a second direction different from the first direction.

5. The method of claim 1, wherein a portion of the first dielectric structure and the first cap layer of the hybrid structure are exposed through the opening.

6. The method of claim 1, wherein the removing of the patterned sacrificial layer and the portion of the reverse material further comprises:
   performing a planarization to remove the portion of reverse material and a portion of the patterned sacrificial layer, wherein a top surface of the remaining patterned sacrificial layer and a top surface of the remaining reverse material are aligned with each other; and
   removing the remaining patterned sacrificial layer.

7. The method of claim 1, further comprising removing portions of the first cap layer exposed through the second cap layer prior to the forming of the first insulating layer.

8. A method for forming a semiconductor structure, comprising:
   forming a first metallization layer and a first cap layer over a substrate, wherein the first metallization layer and the first cap layer comprise different materials;
   removing portions of the first metallization layer and portions of the first cap layer to form at least a hybrid structure over the substrate;
   forming a first dielectric structure surrounding the hybrid structure;
   forming a second cap layer over the hybrid structure, wherein the second cap layer comprises a material different from the material of the first cap layer;

forming a protecting layer over the substrate, wherein the protecting layer comprises a material different from a material of the first dielectric structure;
forming a second dielectric structure over the substrate;
forming a trench in the second dielectric structure, the protecting layer and the second cap layer;
removing the first cap layer to form a via opening; and
filling the via opening and the trench with a second metallization layer.

9. The method of claim 8, wherein the first cap layer comprises a metal material, a semiconductor material, or an insulating material.

10. The method of claim 9, wherein the first cap layer comprises the metal material different from a material of the first metallization layer.

11. The method of claim 8, wherein the second cap layer and the protecting layer respectively comprise an insulating material.

12. The method of claim 8, further comprising performing a planarization operation on a portion of the second metallization layer to form a via structure in the via opening and a metallization feature in the trench.

13. The method of claim 8, wherein the hybrid structure extends along a first direction, and the second cap layer extends along a second direction different from the first direction.

14. A method for forming a semiconductor structure, comprising:
forming a first metallization layer and a first cap layer over a substrate;
removing portions of the first metallization layer and portions of the first cap layer to form a plurality of first metallization features and recesses separating the plurality of first metallization features over the substrate;
forming a first protecting layer over the substrate;
forming a first dielectric structure over the first protecting layer and filling the recesses;
forming a second cap layer over the first cap layer, at least one of first metallization features and portions of the first dielectric structure;
forming a second protecting layer over the second cap layer;
forming a second dielectric structure having a trench over the substrate;
removing the first cap layer to form a via opening coupled to the trench; and
forming a via structure in the via opening and a second metallization feature in the trench.

15. The method of claim 14, wherein the first dielectric structure extended in a first direction, and the second cap layer extended in a second direction different from the first direction.

16. The method of claim 14, wherein the first cap layer is exposed through a bottom of the trench, and the second cap layer, the second protecting layer and the second dielectric structure are exposed through sidewalls of the trench.

17. The method of claim 14, wherein the first metallization feature is exposed through a bottom of the via opening, and the first protecting layer is exposed through sidewalls of the via opening.

18. The method of claim 14, wherein the forming of the second protecting layer further comprises:
forming a patterned sacrificial layer over the substrate, wherein the patterned sacrificial layer has an opening exposing the first cap layer, portions of the first protecting layer and portions of the first dielectric structure;
filling the opening with a reverse material; and
removing the patterned sacrificial layer.

19. The method of claim 18, further comprising performing a planarization to remove a portion of the reversed material and a portion of the patterned sacrificial layer prior to the removing of the patterned sacrificial layer.

20. The method of claim 18, further comprising removing portions of the first cap layer exposed through the second cap layer prior to the forming of the second protecting layer.

* * * * *